(12) United States Patent
Papasouliotis et al.

(10) Patent No.: US 7,863,190 B1
(45) Date of Patent: Jan. 4, 2011

(54) METHOD OF SELECTIVE COVERAGE OF HIGH ASPECT RATIO STRUCTURES WITH A CONFORMAL FILM

(75) Inventors: George D. Papasouliotis, North Andover, MA (US); Mihai Buretea, San Francisco, CA (US); Collin Mui, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/623,333

(22) Filed: Nov. 20, 2009

Related U.S. Application Data (63) Continuation of application No. 11/473,372, filed on Jun. 21, 2006, now Pat. No. 7,625,820.

(51) Int. Cl.
*H01L 21/44* (2006.01)
(52) U.S. Cl. ............... 438/677; 438/661; 257/E21.553
(58) Field of Classification Search ............ 438/597, 438/618, 681, 674, 677; 257/E21.553
See application file for complete search history.

(56) References Cited

U.S. PATENT DOCUMENTS

| | | | |
|---|---|---|---|
| 5,314,724 A | 5/1994 | Tsukune et al. |
| 5,525,550 A | 6/1996 | Kato |
| 5,527,561 A | 6/1996 | Dobson |
| 5,597,395 A | 1/1997 | Bocko et al. |
| 5,705,028 A | 1/1998 | Matsumoto |

(Continued)

FOREIGN PATENT DOCUMENTS

JP  63076335  4/1988

(Continued)

OTHER PUBLICATIONS

"Atomic Layer Deposition of Metal Oxide Thin Films," A thesis presented by Dennis Michael Hausmann, Harvard University, 186 pages, Jul. 2002.

(Continued)

*Primary Examiner*—Alexander G Ghyka
*Assistant Examiner*—Seahvosh J Nikmanesh
(74) *Attorney, Agent, or Firm*—Weaver Austin Villeneuve & Sampson LLP (57) ABSTRACT

Methods for forming thin dielectric films by selectively depositing a conformal film of dielectric material on a high aspect ratio structure have uses in semiconductor processing and other applications. A method for forming a dielectric film involves providing in a deposition reaction chamber a substrate having a gap on the surface. The gap has a top opening and a surface area comprising a bottom and sidewalls running from the top to the bottom. A conformal silicon oxide-based dielectric film is selectively deposited in the gap by first preferentially applying a film formation catalyst or a catalyst precursor on a portion representing less than all of the gap surface area. The substrate surface is then exposed to a silicon-containing precursor gas such that a silicon oxide-based dielectric film layer is preferentially formed on the portion of the gap surface area. The preferential application of the catalyst or catalyst precursor may occur either at the top of the gap, for example to form a sacrificial mask, or at the bottom of the gap to create a seamless and void-free gap fill.

11 Claims, 7 Drawing Sheets

U.S. PATENT DOCUMENTS

| | | |
|---|---|---|
| 5,985,770 A | 11/1999 | Sandhu et al. |
| 6,030,881 A | 2/2000 | Papasouliotis et al. |
| 6,064,104 A | 5/2000 | Omid-Zohoor et al. |
| 6,102,993 A | 8/2000 | Bhandari et al. |
| 6,133,160 A | 10/2000 | Komiyama et al. |
| 6,184,108 B1 | 2/2001 | Omid-Zohoor et al. |
| 6,184,143 B1 | 2/2001 | Ohashi et al. |
| 6,300,219 B1 | 10/2001 | Doan et al. |
| 6,335,261 B1 | 1/2002 | Natzle et al. |
| 6,352,953 B1 | 3/2002 | Seki et al. |
| 6,372,669 B2 | 4/2002 | Sandhu et al. |
| 6,503,330 B1 | 1/2003 | Sneh et al. |
| 6,504,233 B1 | 1/2003 | Gorczyca et al. |
| 6,511,539 B1 | 1/2003 | Raaijmakers |
| 6,531,377 B2 | 3/2003 | Knorr et al. |
| 6,540,838 B2 | 4/2003 | Sneh et al. |
| 6,551,339 B2 | 4/2003 | Gavronsky |
| 6,551,399 B1 | 4/2003 | Sneh et al. |
| 6,624,091 B2 | 9/2003 | Yuan |
| 6,780,789 B1 | 8/2004 | Yu et al. |
| 6,784,101 B1 | 8/2004 | Yu et al. |
| 6,802,944 B2 | 10/2004 | Ahmad et al. |
| 6,867,152 B1 | 3/2005 | Hausmann et al. |
| 6,903,005 B1 | 6/2005 | Marsh |
| 6,908,862 B2 | 6/2005 | Li et al. |
| 6,949,481 B1 | 9/2005 | Halliyal et al. |
| 6,984,591 B1 | 1/2006 | Buchanan et al. |
| 7,097,878 B1 | 8/2006 | Rulkens et al. |
| 7,129,189 B1 | 10/2006 | Hausmann et al. |
| 7,148,155 B1 | 12/2006 | Tarafdar et al. |
| 7,163,899 B1 | 1/2007 | Cho et al. |
| 7,202,185 B1 | 4/2007 | Hausmann et al. |
| 7,223,707 B1 | 5/2007 | Papasouliotis et al. |
| 7,271,112 B1 | 9/2007 | Papasouliotis et al. |
| 7,288,463 B1 | 10/2007 | Papasouliotis |
| 7,294,583 B1 | 11/2007 | Rulkins et al. |
| 7,297,608 B1 | 11/2007 | Papasouliotis et al. |
| 7,354,849 B2 | 4/2008 | Plombon et al. |
| 7,482,247 B1 | 1/2009 | Papasouliotis et al. |
| 7,491,653 B1 | 2/2009 | Papasouliotis et al. |
| 2001/0049205 A1 | 12/2001 | Sandhu et al. |
| 2002/0094388 A1 | 7/2002 | Fonash et al. |
| 2002/0102365 A1 | 8/2002 | Narasimhan et al. |
| 2003/0015764 A1 | 1/2003 | Raaijmakers et al. |
| 2003/0092241 A1 | 5/2003 | Doan et al. |
| 2003/0129828 A1 | 7/2003 | Cohen et al. |
| 2003/0134741 A1 | 7/2003 | Weisbeck et al. |
| 2003/0157781 A1 | 8/2003 | Macneil et al. |
| 2004/0025787 A1 | 2/2004 | Selbrede et al. |
| 2004/0043149 A1 | 3/2004 | Gordon et al. |
| 2004/0043569 A1 | 3/2004 | Ahn et al. |
| 2004/0079728 A1 | 4/2004 | Mungekar et al. |
| 2004/0092095 A1 | 5/2004 | Nguyen et al. |
| 2004/0115898 A1 | 6/2004 | Moghadam et al. |
| 2004/0222490 A1 | 11/2004 | Raaijmakers et al. |
| 2004/0247787 A1 | 12/2004 | Mackie et al. |
| 2005/0054213 A1 | 3/2005 | Derderian et al. |
| 2005/0112282 A1 | 5/2005 | Gordon et al. |
| 2005/0239264 A1 | 10/2005 | Jin et al. |
| 2005/0271813 A1 | 12/2005 | Kher et al. |
| 2006/0087000 A1 | 4/2006 | Okuno |
| 2006/0127578 A1 | 6/2006 | Li et al. |
| 2006/0246699 A1 | 11/2006 | Weidman et al. |

FOREIGN PATENT DOCUMENTS

| | | |
|---|---|---|
| WO | WO02/27063 | 4/2002 |
| WO | WO 03/083167 A1 | 9/2003 |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35µm Interconnects", Interconnect Technology Conference, 1998, Proceedings of the IEEE 1998 International Volume, pp. 1-3, Jun. 1998.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 127 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 µm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.

METHOD OF SELECTIVE COVERAGE OF HIGH ASPECT RATIO STRUCTURES WITH A CONFORMAL FILM

CROSS-REFERENCE TO RELATED APPLICATIONS

This application is a continuation of U.S. application Ser. No. 11/473,372, filed Jun. 21, 2006, naming Papasouliotis et al. as inventors, which is herein incorporated by reference in its entirety and for all purposes.

FIELD OF THE INVENTION

This invention relates to methods for forming thin dielectric films. More particularly, the invention pertains to methods for forming thin dielectric films by selectively depositing a conformal film of dielectric material on a high aspect ratio structure.

BACKGROUND OF THE INVENTION

Conformal, uniform dielectric films have many applications in semiconductor manufacturing. In the fabrication of sub-micron integrated circuits (ICs) several layers of dielectric film are deposited. Four such layers are shallow trench isolation (STI), premetal dielectric (PMD), inter-metal dielectric (IMD) and interlayer dielectric (ILD). All four of these layers require silicon dioxide films that fill features of various sizes and have uniform film thicknesses across the wafer.

Chemical vapor deposition (CVD) has traditionally been the method of choice for depositing silicon dioxide films. However, as design rules continue to shrink, the aspect ratios (depth to width) of features increase, and traditional CVD techniques can no longer provide void-free gap-fill in these high aspect ratio features.

An alternative to CVD is atomic layer deposition (ALD). ALD methods involve self-limiting adsorption of reactant gases and can provide thin, conformal dielectric films within high aspect ratio features. An ALD-based dielectric deposition technique typically involves adsorbing a metal containing precursor onto substrate surface, then, in a second procedure, introducing a silicon oxide precursor gas. The silicon oxide precursor gas reacts with the adsorbed metal precursor to form a thin film of metal doped silicon oxide. However, one drawback to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

A related technique, referred to as pulsed deposition layer (PDL) or rapid surface-catalyzed vapor deposition (RVD) processing, is another alternative. PDL is similar to ALD in that reactant gases are introduced alternately over the substrate surface, but in PDL, the silicon oxide film can grow more thickly due to the use of a particular class of precursors that catalyze the reaction. Thus, PDL methods allow for rapid film growth similar to using CVD methods but with the film conformality of ALD methods.

As will be in discussed in detail below, PDL is a two-step process. First, a silicon substrate with a trench or gap on its surface is exposed to a catalyst to form an activated surface. Second, the substrate is then exposed to a silicon-oxide precursor gas. The catalyst-activated surface decomposes the silicon-oxide precursor leading ultimately to growth of a conformal silica film on the substrate. The two processes can be repeated iteratively, which leads to film growth on the exposed substrate surfaces. Ideally, the oxide film would grow uniformly with each cycle to result in a dense uniform film that completely fills the gap structure. However, the processes may fail to completely fill a structure, especially if the gap structure has a high aspect ratio or re-entrant features.

Figure 1:
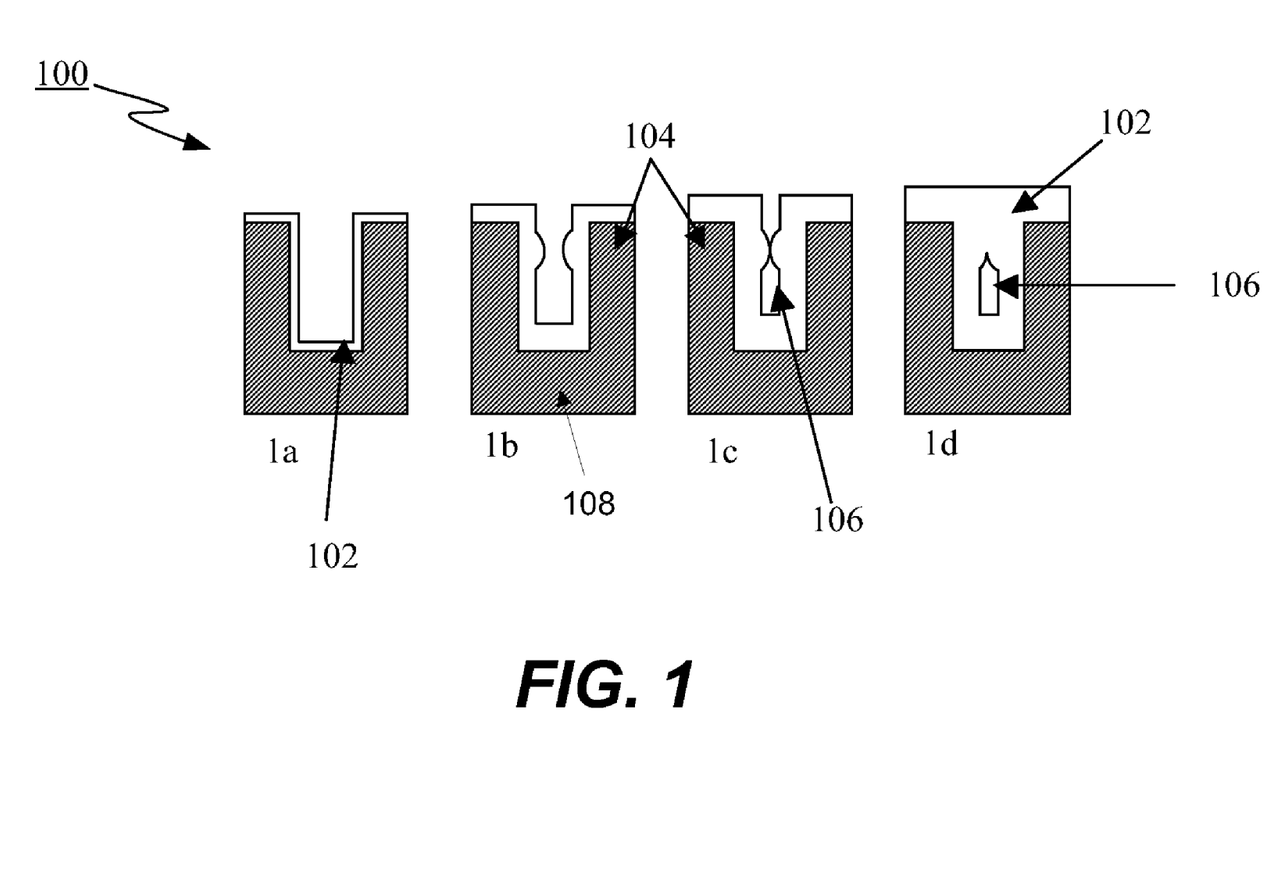
FIG. 1 illustrates an example of an incomplete gap fill with a void.

FIG. 1 illustrates an example of an incomplete gap fill with a void. PDL and ALD are known for their capability to form conformal films in very high aspect ratio structures. Initially, as illustrated in FIG. 1a, film growth 102 is uniform in the gap structure or trench, generally numbered 100. However, as the gap structure narrows, FIG. 1b illustrates that the silica precursor can no longer diffuse to the bottom 108 of the trench 100 and film grows preferentially in the upper part 104 of the trench 100. With each iteration of the PDL process, as further illustrated in FIGS. 1c and 1d, an undesirable void 106 is eventually formed in the trench 100. Not to be bound by any single theory, it is believed that diffusion of the silica precursor is slower than the reaction of the silica precursor with the catalyst-decorated surface. This leads to preferential film growth in the upper portion of a trench where the silicon-oxide precursor is readily accessible. The film effectively plugs the upper portion of the trench, forming the void. Void formation is further evidenced when filling re-entrant structures whereby the mouth or top of the structure is narrower than the bottom.

Void formation can also occur in other ways. For example, the highly conformal nature of the PDL and ALD processes results in the formation of seams in gap fill applications where the two fronts of the growing dielectric film meet at the middle of the trench or gap. Upon annealing for film densification or acidic etching solution during subsequent wet process steps, the low density areas of the seams can expand and may result in voids.

There may also be applications where high aspect ratio trenches need to be covered only partially by the dielectric film. For example, an oxide film may be used as a sacrificial mask preventing etching of the underlying structure, in particular the corner features at the top of the trenches. In this application, the oxide film need not extend to the bottom of the trench, and a film cornering only the top ½ or ⅔, for example, of the trench may be preferred.

Additionally, current STI and PMD deposition trench fill schemes deposit the same amount of film inside the trench and on the field. Therefore, a long chemical mechanical polished (CMP) step is required to remove the film on the field.

Accordingly, improved techniques and methods would be desirable to conduct gap fill and other dielectric film depositions using conformal dielectric deposition techniques, such as PDL or ALD.

SUMMARY OF THE INVENTION

The present invention provides methods for forming thin dielectric films by selectively depositing a conformal film of dielectric material on a high aspect ratio structure.

A method for forming a dielectric film in accordance with the invention involves providing in a deposition reaction chamber a substrate having a gap on the surface. The gap has a top opening and a surface area comprising a bottom and sidewalls running from the top to the bottom. A conformal silicon oxide-based dielectric film is selectively deposited in the gap by first preferentially applying a film formation catalyst or a catalyst precursor on a portion representing less than all of the gap surface area. The substrate surface is then exposed to a silicon-containing precursor gas such that a silicon oxide-based dielectric film layer is preferentially formed on the portion of the gap surface area.

The preferential application of the catalyst or catalyst precursor may occur either at the top of the gap, for example to form a sacrificial mask, or at the bottom of the gap to create a seamless and void-free gap fill. These and other aspects and advantages of the invention are described in the detailed description that follows.

BRIEF DESCRIPTION OF THE DRAWINGS

The accompanying drawings, which are incorporated into and constitute a part of this specification, illustrate one or more embodiments and, together with the detailed description, serve to explain the principles and implementations of the invention.

In the drawings.

DESCRIPTION OF SPECIFIC EMBODIMENTS

In the following detailed description, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

The method provided is well suited to a variety of semiconductor processing and other applications where control over film coverage is important, such as in the formation of a sacrificial mask over high aspect ratio gaps, or to achieve bottom-up gap fill of high aspect ratio gaps in a conformal dielectric deposition process such as PDL or ALD.

General Deposition Process Parameters

The dielectric deposition may be achieved using any suitable conformal process, for example ALD or PDL. The dielectric may be any suitable silicon oxide-based material, doped or undoped, for example undoped silicon dioxide (undoped silica glass (USG)). Examples of doped silica films may be fluorosilicate glass, phosilicate glass, borophosphosthcate glass, or other carbon doped low-k materials. In general, a layer thickness of about 300-15,000 Å or 500-1500 Å, for example about 1000 Å is suitable.

Dielectric deposition by PDL is preferred. The invention may be used for deposition of $SiO_2$, SiN or SiC films. The formation of silica films by PDL can be catalyzed by metal containing or metal and metalloid-free compounds, such as acidic compounds. Specific examples are aluminum-containing catalyst precursors, for example, trimethylaluminum (Al$(CH_3)_3$), or phosphoric acid ($H_3PO_4$).

A PDL process to form a conformal dielectric film begins with placement of a substrate into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. The present invention may be used in various dielectric gap-fill applications, such as filling of STI or PMD features.

A catalyst or a catalyst precursor is supplied into the deposition chamber so as to substantially saturate the substrate surface. Any compound or precursor that can sufficiently adsorb onto or react with the substrate surface and prepare it to sufficiently further react with the subsequently added silicon-containing precursor may be used. In addition, the catalyst or precursor should be capable of aiding the catalytic polymerization of the subsequently added silicon-containing precursor to produce a film thicker than a monolayer.

Metal-containing compounds suitable as catalyst precursors in a PDL process include aluminum-containing compounds, for example, hexakis(dimethylamino)aluminum ($Al_2(N(CH_3)_2)_6$) or trimethyl aluminum ($Al(CH_3)_3$). Other suitable aluminum-containing precursors include, for example, triethylaluminum ($Al(CH_2CH_3)_3$) or aluminum trichloride ($AlCl_3$). Other metal-containing precursors that can be deposited to reactivate the catalytic surface include, but are not limited to, zirconium, hathium, gallium, titanium, niobium, tantalum, and their oxides or nitrides.

Metal- and metalloid-free compounds suitable as catalysts in a PDL process include organic acids (e.g., acetic acid), anhydrides of organic acids, dialkylphosphates, alkysphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids (e.g., phosphoric acid), anhydrides of inorganic acids, and combinations thereof.

Forming a catalyst-activated layer is a self-limiting process. Relevant process conditions can include substrate (e.g., wafer) temperature, reactor pressure, reactant partial pressure, and combinations thereof, and can very widely depending upon the particular catalyst or precursor used. For a metal containing catalyst precursor, pressures can range broadly, e.g., between about 1 mTorr and 760 Torr. Typical pressures range between about 100 and 750 mTorr and typical temperatures range between about 250 and 300 degrees Celsius. Flow rates of aluminum-containing precursor gas can range broadly, e.g., between about 1 and 10000 sccm. Preferred flow rates of aluminum-containing precursor gas range between about 100 and 400 sccm. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 1 to 2 seconds is found to be sufficient.

For a metal- and metalloid-free catalyst, pressures can range broadly, e.g., between about 1 mTorr and 760 Ton. Typical pressures range between about 500 and 1250 mTorr and typical temperatures range between about 0 and 300° C., for example between about 20 and 250° C., such as 20, 50, 100, 200, 230 or 250° C. in various implementations. Flow rates of catalyst reactants can range broadly, e.g., between about 1 and 10000 sccm in the gas phase. Preferred gas phase flow rates of the catalyst range between about 1 and 100 sccm. Catalysts may also alternatively be delivered to the reactor and/or the substrate surface in the liquid phase. Suitable liquid phase delivery flow rates can be between 0.01 and 100 mL/min; or the liquid catalysts can be delivered to the substrate surface by dipping, painting, spraying, etc. Suitable liquid phase catalyst concentrations can vary widely, for example from about $10^{-3}$ to 12M, such as about 0.01, 0.1, 1, 2, 5, 7 or 10M. Exposure times suitable for forming a saturated layer are typically only seconds, e.g., about 1 to 10 seconds. In some embodiments, for example, an exposure time of about 2 seconds or 5 seconds is found to be sufficient. Given the directions and parameters provided herein, one of skill in the art will be able to readily determine the appropriate conditions for effective use of a given catalyst in accordance with the present invention.

After the catalyst layer is formed an inert gas is preferably used to purge the substrate surface and reaction chamber. It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

Following the chamber purge, the catalyst-activated substrate surface is exposed to a silicon-containing precursor gas under conditions selected for growth of a conformal dielectric film. Any suitable silicon-containing precursor that can sufficiently adsorb onto and react with the catalytic layer to form a dielectric film may be used. In addition, the silicon-containing precursor should be capable of polymerization when exposed to the adsorbed catalyst to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol $((C_4H_9O)_3SiOH)$, tris(tert-pentoxy)silanok$(C_5H_{11}O)_3SiOH)$, di(tert-butoxy)silandiol $((C_4H_9O)_2Si(OH)_2)$ and methyl di(tert-pentoxy)silanol.

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. As noted, the process conditions in accordance with the present invention are dynamic, at first selected to optimize surface smoothness, then selected to optimize conformality and deposition rate. Generally, temperatures can range from about 150 to 300° C. A typical initial deposition temperature is about 200° C.; and 230° C. for subsequent deposition stages. Pressures can range broadly, e.g., between about 1 mTorr and 760 Torr. Typical pressures range between about 500 mTorr and 20 Torr. Flow rates of silicon-containing precursor gas can range broadly, e.g., between about 1 and 10000 sccm. Preferred flow rates of silicon-containing precursor gas range between about 200 and 1000 sccm. Exposure times can range broadly, e.g., between about 1 milliseconds and 200 seconds. Preferred exposure times typically range between about 10 and 60 seconds. The number of separate exposures to silicon-containing precursor will primarily depend upon the desired final film thickness. Typical numbers of silicon-containing precursor exposure cycles for a STI feature 0.1 micron in diameter range between about 2 and 4. Again, as with the temperature process condition, these other process conditions may be modulated alone or in combinations in the dynamic process of the invention in accordance with the parameters noted above.

While the invention is not limited to this theory of operation, it is believed that the catalyst is adsorbed onto or reacts with the substrate surface, and the accumulation of dielectric film is achieved via a polymerization process. The activated substrate surface layer can catalytically polymerize the silicon-containing precursor to produce growing chains of silica. After a period of growth determined by the substrate temperature, the silica polymer can "gel" or "crosslink" to form a solid silicon oxide.

The catalyst and silicon-containing precursor exposures may be repeated a number of times, for example a total of 2-5 times, to build up a silica nanolaminate structure forming the completed dielectric film. For example, the operations might be repeated until a gap is filled by the deposited dielectric to the diffusion limitations of the process. The operations of exposing the substrate to the catalyst and the silicon-containing precursor can be carried out in a single chamber, or in separate reactor chambers.

Top Fill of High Aspect Ratio Structures

A method is provided to partially fill the upper portion of a high aspect ratio structure. This technique can provide for a sacrificial mask layer for the structures to protect corner features of the trench or gap, for example. A modified PDL oxide process may be used that promotes film formation at the top of the trench and prevents film formation at the bottom of the trench.

As described above, the formation of silicon oxide-based dielectric films requires exposure to either a catalyst or a catalyst precursor followed by a silicon-oxide precursor gas. The embodiments discussed below will be described with reference to the use of trimethylaluminum (TMA) as a catalyst, but other catalysts or catalyst precursors as described above may be used. The embodiments will also be described with reference to the use of tris(tert-pentoxy)silanol (TPOSL) as the silica precursor to react with TMA, but other silica precursors as described above may be used.

Preventing exposure of a particular section of a trench to either one of the two reactants will inhibit film formation at that section. Control of the catalyst or catalyst precursor can be accomplished by varying the supply in the reactor (soak time) or varying the average time it is in the reactor (residence time).

TABLE 1

| Outcome | TMA soak time (seconds) | Residence time (seconds) |
|---|---|---|
| Conformal coverage | 1 | 0.031 |
| No coverage | 10 | 0.0224 |
| Partial coverage | 20 | 0.0224 |
| Conformal coverage | 20 | 0.02654 |
| Conformal coverage | 30 | 0.02904 |

Table 1 correlates the outcome of the trench coverage to the residence and soak times of a catalyst, namely TMA. It illustrates the dependence of trench coverage on process conditions whereby the catalyst or catalyst precursor may be diluted with an inert gas, such as nitrogen, to vary the soak and residence times. By controlling the soak time and/or residence time, the catalyst or catalyst precursor may be prevented from fully penetrating the entire depth of the trench and only applied to the upper portion of the trench.

As illustrated in Table 1, in this implementation, film deposition is completely stopped for residence time below 0.0224 sec and TMA soak time of 10 sec, while under normal deposition process operating conditions (residence time=0.031 sec. and soak time is 1 sec.) the trench is conformally covered. When the residence time is 0.0224 sec. and soak time is 20 sec., the trench is only partially covered. Thus, conformal coverage of the trench occurs at longer soak and residence times and partial coverage of the trench occurs at lower soak and residence times.

TABLE 2

| $N_2$ set (sccm) | TMA soak (sec) | TOX (Å) |
|---|---|---|
| 200 | 1 | 1399 |
| 300 | 10 | 12.51 |
| 300 | 20 | 772 |
| 300 | 30 | 834 |
| 250 | 10 | 1466 |
| 250 | 20 | 1466 |
| 250 | 30 | 1510 |
| 225 | 10 | 1499 |
| 225 | 20 | 1487 |
| 225 | 30 | 1544 |
| 275 | 10 | 125 |
| 275 | 20 | 850 |
| 275 | 30 | 756 |

Table 2 illustrates the use nitrogen as an inert dilution gas in the catalyst station to modulate the residence time of the catalyst (TMA), which in turn controls film deposition (i.e., the thickness of the oxide (TOX)). The experiment was run on a blanket wafer. When the nitrogen flow is increased by 50% from 200 sccm to 300 sccm, and the soak time is changed from 1 sec. to 10 sec., the thickness of the oxide decreases substantially from 1300 Å to 12.51 Å. Thus, by varying the parameters above, the location and extent of film deposition may be controlled. In fact, Table 2 shows that film formation can stop completely as dilution increases and residence time decreases.

Figure 2:
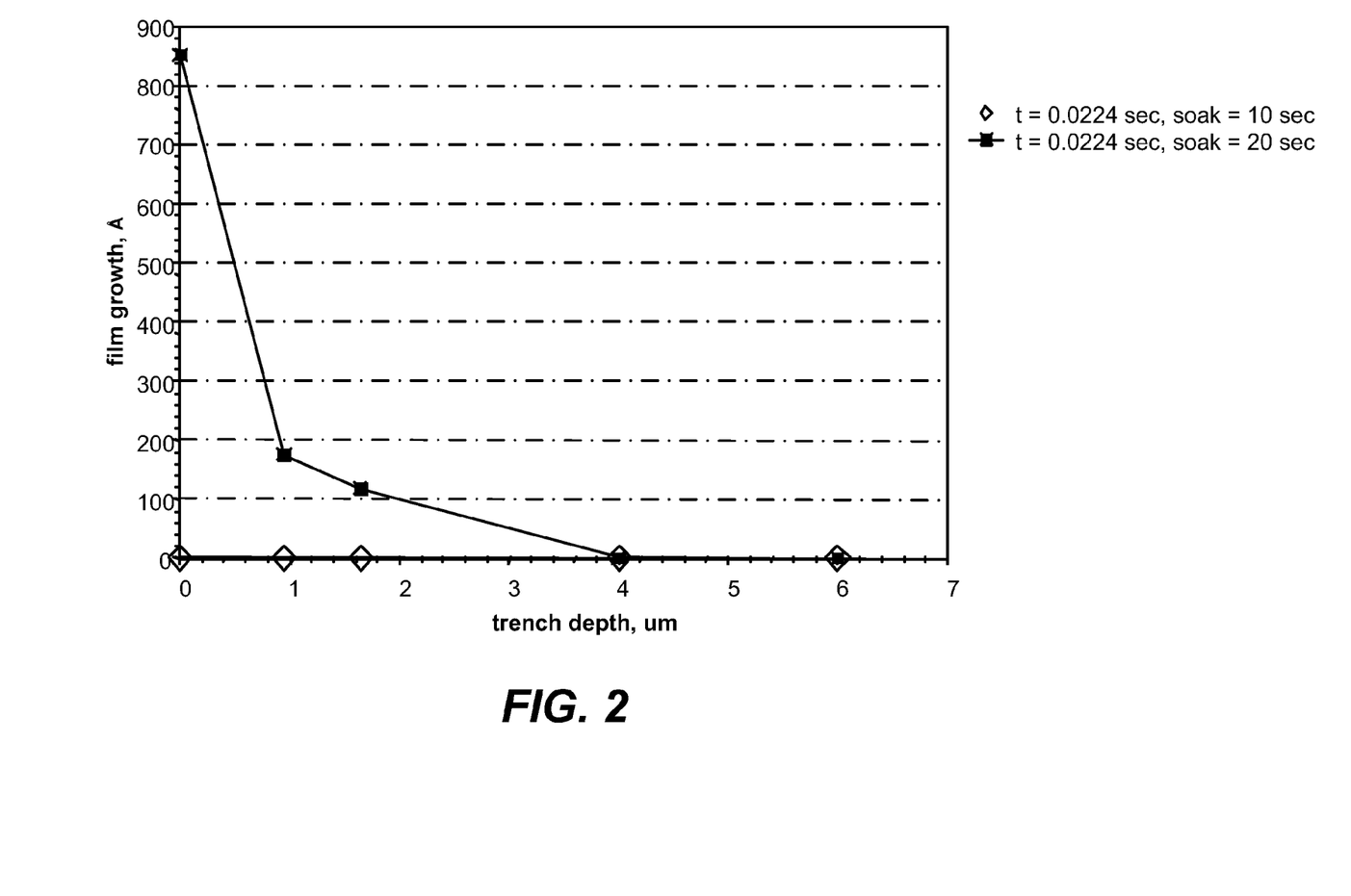
FIG. 2 illustrates a graph comparing trench coverage to residence time and soak time in accordance with an embodiment of the present invention.

Examples are discussed herein for exemplary purposes only and are not intended to be limiting. As discussed above, by varying the residence time and soak time, a great degree of control may be exercised to limit film coverage in a trench. FIG. 2 illustrates a graph comparing trench coverage to residence time and soak time. The residence time (t) is 0.0224 sec. and soak times are varied from 10 sec to 20 sec. A soak time of 10 sec. produces no film deposition in the trench. However, at 20 sec., film deposition decreased from about 850 Å to 0 Å and from 0 um to 4 um into the 6 um deep trench, illustrating that substantial catalyst application and film layer formation occurred at the top of the trench and not at the bottom of the trench.

Figure 3A:
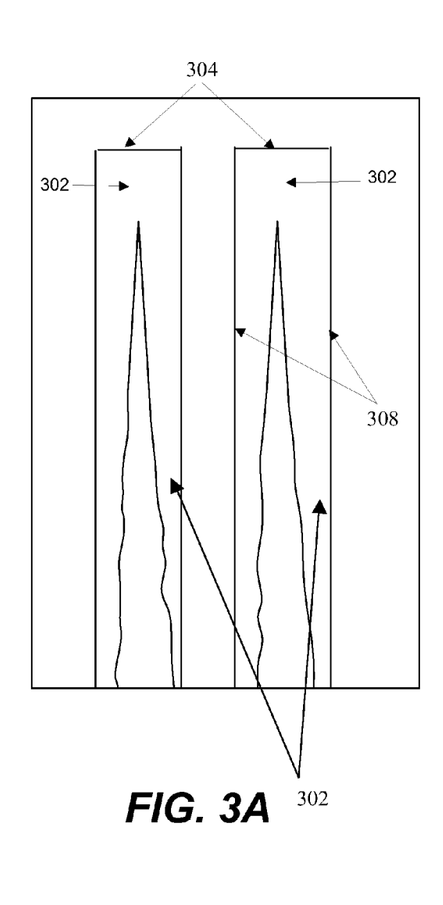
FIGS. 3A-3C illustrate film coverage of the trench with a residence time and soak time in accordance with an embodiment of the present invention.
Figure 3B:
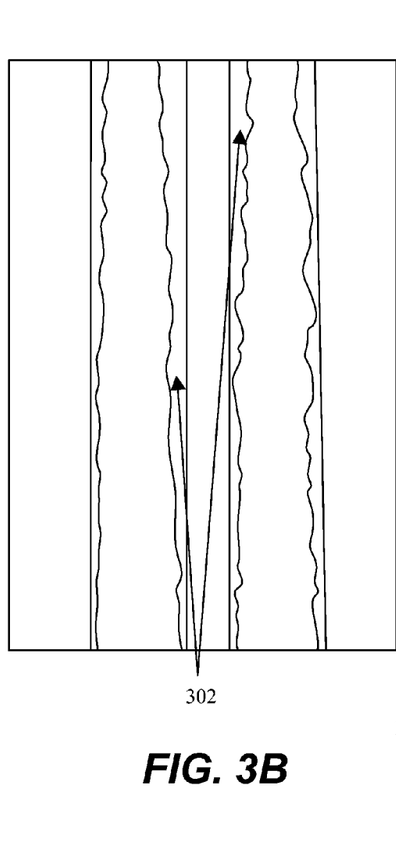
Figure 3C:
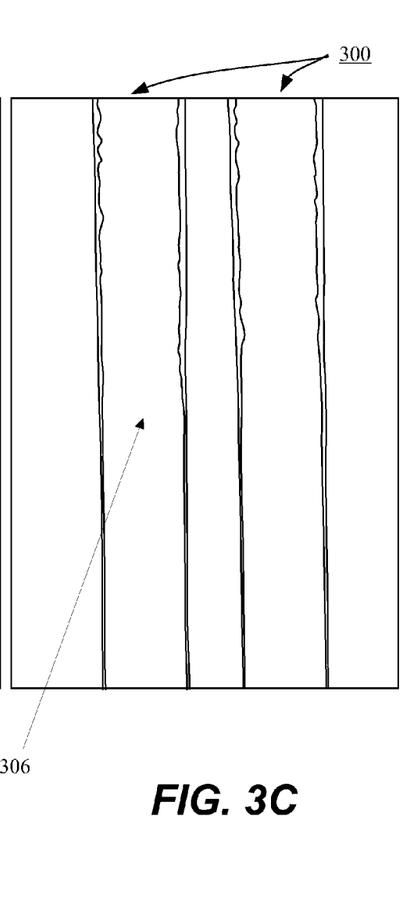

This example is further illustrated in FIGS. 3A-3C. FIGS. 3A-3C illustrate film coverage of two trenches with a residence time of 0.0224 sec. and a soak time of 20 sec. FIG. 3A illustrates the upper portion of the trenches, generally numbered 300. A dielectric film layer 302 is formed at the top 304 and sidewalls 308 of the trenches 300. Formation of the dielectric film layer 302 at the top 304 may be used as sacrificial mask.

One benefit of forming the dielectric film layer 302 at the top 304 is its use as a sacrificial mask to protect corner features of the gap. Corner clipping may also occur when etching at regions of the trench or gap where deposition components are relatively low, e.g. at the top corners of the gap profile, and may cause significant damage to structural features that define the gap. Top corner rounding of the gap is critical to avoid formation of parasitic corner transistors, to minimize shifts in threshold voltage and to prevent premature gate dielectric breakdown. The sacrificial mask may be used to prevent defects and device yield degradation.

FIG. 3B illustrates the middle portion of the trenches 300 and FIG. 3C illustrates the bottom portion of the trenches 300. Formation of the film 302 decreases as trench 300 depth increases. Eventually, as illustrated in FIG. 3C, no further film deposition is observed at a trench depth of about 4 um 306.

Bottom Fill of High Aspect Ratio Structures

In an alternative method for forming a dielectric film, preferential application of the catalyst occurs at the bottom of the trench. This may be achieved by using a more active catalyst or catalyst precursor at the bottom of the trench than in the upper portions of the trench. Alternatively, a plasma or chemical agent may be used to reduce the effectiveness of the catalyst or catalyst precursor applied at the upper portions of the trench thereby inhibiting dielectric film growth at the upper portions.

Selective catalyst deposition at the bottom of the trench may be achieved by using a more active catalyst or catalyst precursor, for example TMA, in that region and a less active catalyst, e.g., aluminum trichloride ($AlCl_3$), in the upper region of the trench. In another embodiment, a gradient of catalytic activity may be obtained by selectively inhibiting, deactivating, or destroying catalytic sites in the upper portions of the trench.

Figure 4:
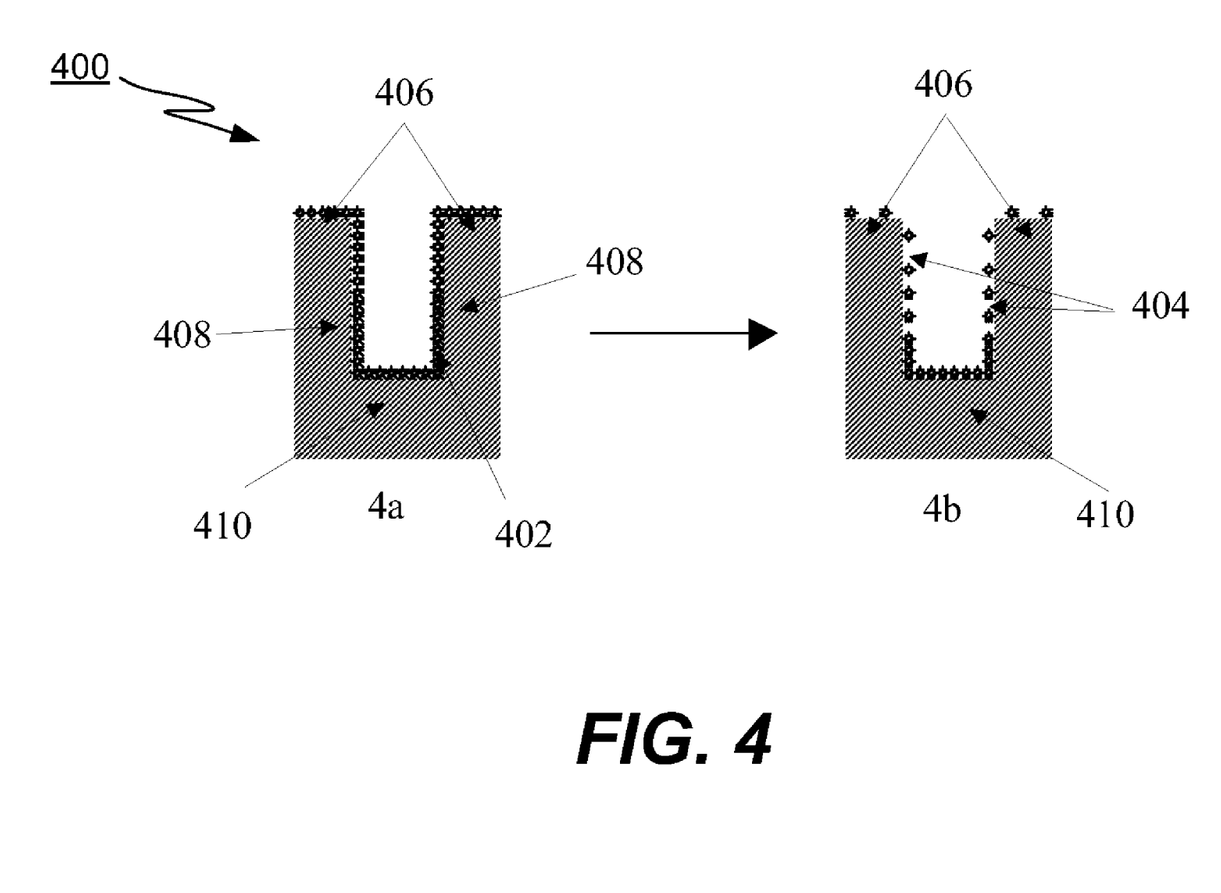
FIG. 4 illustrates the formation of a catalyst gradient in a trench in accordance with the present invention.

FIG. 4 illustrates the formation of a catalyst gradient in a trench. The catalyst 402 may be applied along the top 406, sidewalls 408, and bottom 410 of the trench, generally numbered 400. Once applied, an agent may be used to selectively inhibit, deactivate, or destroy some of the catalytic sites 404 at the top 406 of the trench 400.

The agent that modifies the potency of the catalyst may be a plasma or a chemical agent that is unable to access the lower or bottom portions of the trench. The amount, molecular weight, chemical reactivity and lifetime of the agent may be tuned to achieve the desired catalyst profile. Other factors such as temperature, chamber geometry and the use of radiation may also be used to tune the process.

There are several types of mechanisms that can operate to inhibit film growth. A first relates to agents that increase the rate of cross-linking or termination in the growth process of the silica film. This does not necessarily involve any interaction with TMA or any other PDL catalyst. The inhibiting agent may simply accelerate the rate at which Si—O—Si cross-linking occurs, thereby increasing the film density earlier in the growth process and reducing the access of silanol to catalyst sites. Examples of such agents include but are not limited to $H_2O$, $NH_3$, HCl and metal compounds of the general formula $MX_4$ or $M(OR)_a(OR')_b(OR'')_c(OH)_d$ where M=Si, Ge, Sn, PB, Ti, or Zr and X=H or halogen and a+b+c+d=4; a, b, c, d=0, 1, 2, 3 or 4. Some of the agents listed may also interact with the active catalyst species.

A second type of mechanism involves non-specific chemical or radiation damage to the catalyst as can be caused by exposure to plasma or intense light. This destroys the surface-bound catalyst directly exposed to plasma or radiation, rendering those surfaces inactive or less active towards silanol polymerization.

A third mechanism operates by causing a specific change in the structure of the catalyst by introduction of, for example, a new ligand set. For example, the highly active Al—$CH_3$ moiety would be replaced by an amido group following exposure of the surface-bound TMA to an amine. This process is illustrated in the following reaction scheme in which the very active surface-bound catalyst TMA is transformed into a less active species by reaction with gaseous diisopropylamine:

Agents that can be used to lower the effectiveness of TMA and related catalysts include ammonia, amines, the mineral acids (HCl, HBr, $HNO_3$, $H_2SO_4$, organic acids such as carboxylic, phosphonic or sulphonic. In general, compounds that react with TMA or similar catalysts to form stronger bonds than Al—$CH_3$ inhibit catalysis. Compounds that introduce bulky sidechains, such as isopropyl or t-butyl, to the active catalyst center have the same effect. Furthermore, multidentate ligands (e.g. ethylenediamine, TMEDA, EDTA, dicarboxilyc acids, etc.) that can multiply bond to a single catalytic center or to multiple centers also result in surface-bound species with greater stability and thus lower catalytic activity than TMA.

Figure 5:
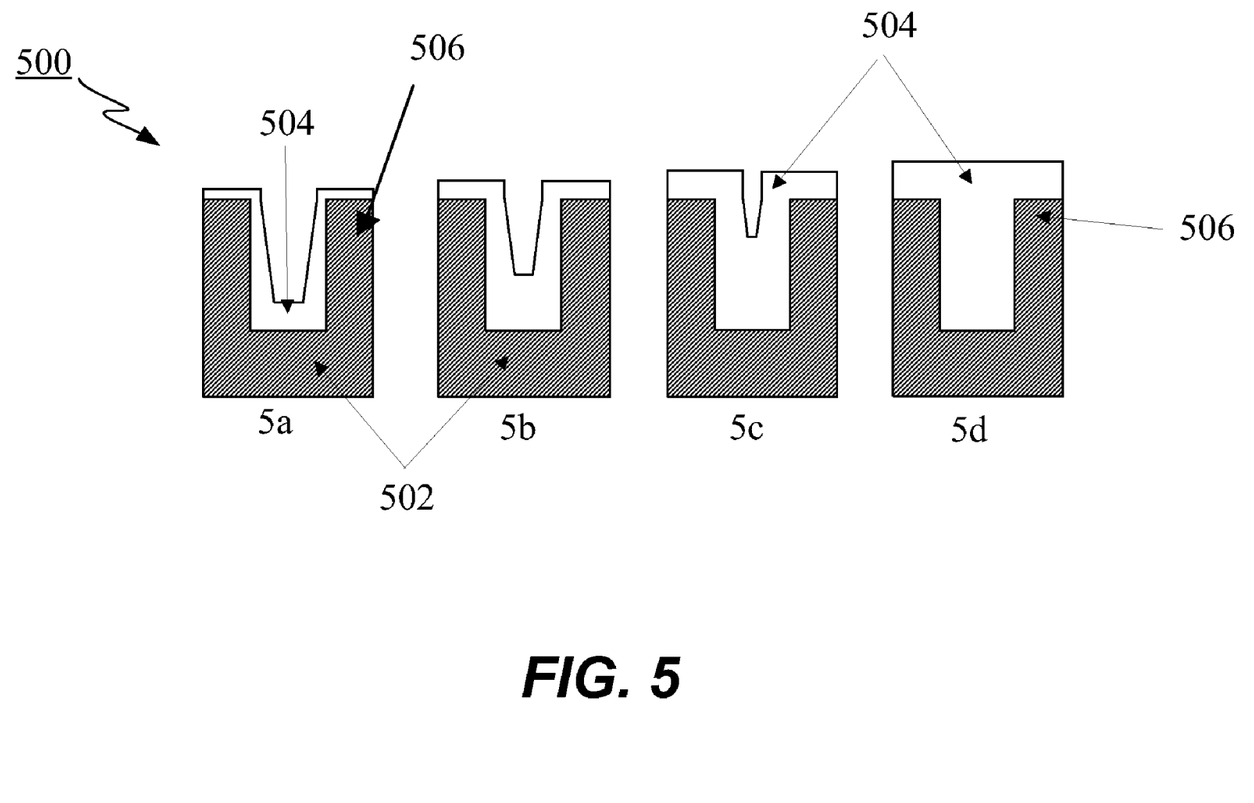
FIG. 5 illustrates an evolution of dielectric film deposition in a trench using the gradient catalyst profile illustrated in FIG. 4.

FIG. 5 illustrates an evolution of dielectric film deposition in a trench using the gradient catalyst profile illustrated in FIG. 4 (4b). In FIG. 5, 5a illustrates dielectric film 504 growth greater at the bottom 502 of the trench 500 than at the top 506 where the catalytic sites are either inhibited, deactivated, or destroyed. Further in time, as illustrated in FIG. 5, 5b and 5c, the film 504 continues to form from the bottom 502 of the trench 500 to the top 506. As a result, a bottom-up gap fill is created whereby no voids or seams are formed as illustrated in FIG. 5, 5d.

PDL generally involves a number of discrete iterative steps. As such, the inhibition step can be inserted into or omitted from each cycle, as desired. The inhibition process can also be altered with each successive cycle to optimize the catalyst gradient for each layer of film.

Figure 6:
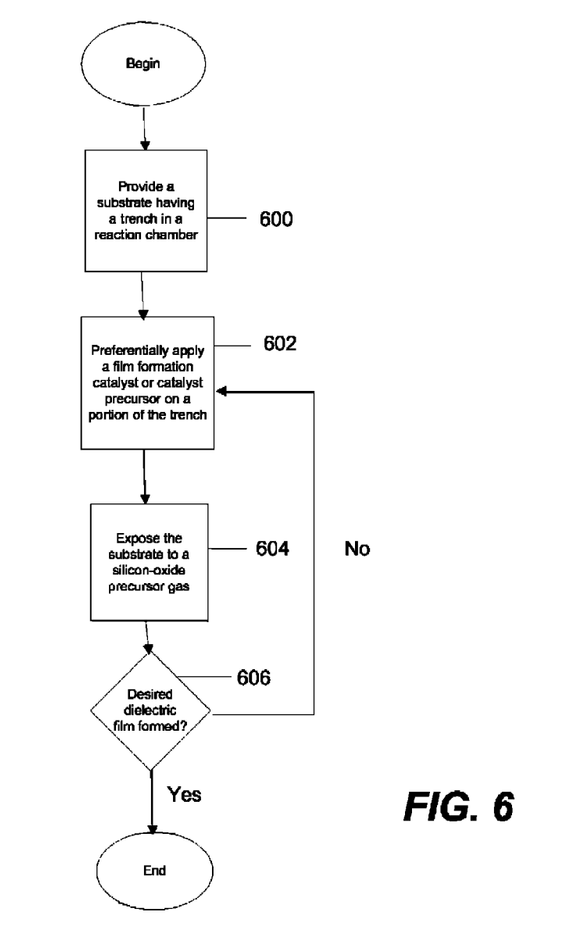
FIG. 6 is a flow diagram of a method for forming a dielectric film in accordance with the present invention.

FIG. 6 is a flow diagram of a method for forming a dielectric film in accordance with the present invention. A substrate with a trench is provided in a deposition reaction chamber at 600. The trench may have a top opening and a surface area comprising a bottom and sidewalls running from the top to the bottom. A film formation catalyst or catalyst precursor is preferentially applied on a portion of the trench at 602. The catalyst or catalyst precursor used may be any materials as described above. The preferential application of the catalyst or catalyst precursor may occur either at the top of the trench, for example to form a sacrificial mask, or at the bottom of the trench to create a seamless and void-free gap fill. Methods for applying the catalyst or catalyst precursor either at the top or bottom of the trench have been described in detail above.

Once applied, the substrate is exposed to a silicon-containing precursor gas at 604. The silicon-containing precursor gas may be any materials described above. Furthermore, by preferentially applying the catalyst on a portion of the trench, the silicon oxide-based dielectric film layer will only be formed on the preferential portion of the trench. The processes of preferentially applying the catalyst at 602 and silicon-containing precursor gas at 604 can be repeated at 606 until the desired dielectric film is formed (i.e., the sacrificial mask is formed or the gap is filled).

Other Embodiments

As discussed above, the dielectric deposition may be by any suitable conformal process, for example ALD or PDL. The dielectric may be any suitable silicon oxide-based material, doped or undoped, for example undoped silicon dioxide (undoped silica glass (USG)). Examples of doped silica films may be fluorosilicate glass, phosilicate glass, borophosphosthcate glass, or carbon doped low-k dielectric materials. Embodiments may also pertain to IMD/ILD, STI and PMD applications. Furthermore, even though the described embodiments of the invention emphasize applications pertaining to the fabrication of semiconductor devices, the scope of the invention is not limited to these applications.

Apparatus

The process operations can be carried out in situ in the same chamber, in an integrated mode (tool), or in separate chambers (with or, preferably, without vacuum break). Some sample apparatus for implementing the invention are described below. While the apparatus described below relates to PDL, it should be understood that these are just examples of deposition and annealing techniques suitable for implementation of the present invention. Several other deposition and anneal techniques, and associated apparatus, examples of which are known in the art, may alternatively be used.

Figure 7:
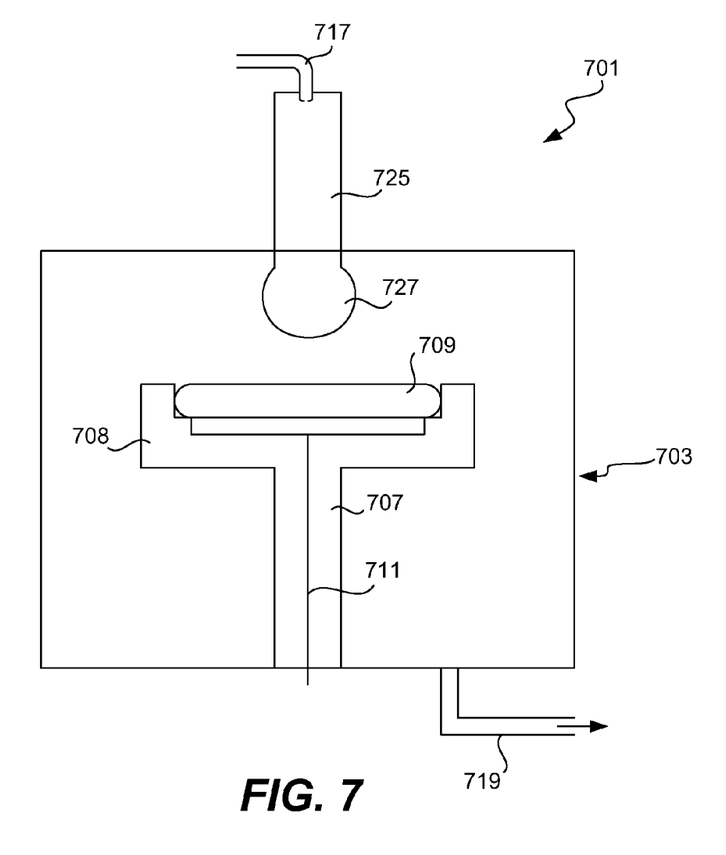
FIG. 7 is a block diagram depicting some components of a suitable reactor for performing dielectric deposition using a PDL process in accordance with one embodiment of this invention.

FIG. 7 is a block diagram depicting some components of a suitable reactor for performing dielectric deposition using a PDL process in accordance with one embodiment of this invention. Note that this apparatus is only an example of suitable apparatus for deposition. Many other apparatuses and systems, including a multi-chambered apparatus, may be used.

As shown, a reactor 701 includes a process chamber 703, which encloses components of the reactor and serves to contain the reactant gases and provide an area to introduce the reactant gases to substrate 709. The chamber walls may be made of or plated with any suitable material, generally a metal that is compatible with the deposition and associated processes conducted therein. In one example, the process chamber walls are made from aluminum.

Within the process chamber, a wafer pedestal 707 supports the substrate 709. The pedestal 707 typically includes a chuck 708 to hold the substrate in place during the deposition reaction. The chuck 708 may be an electrostatic chuck, a mechanical chuck or various other types of chuck as are available for use in the industry and/or research.

A heat transfer subsystem including resistive heaters and/or lines 711 for supplying a heat transfer fluid to the pedestal 707 controls the temperature of pedestal 707. In some embodiments, the heat transfer fluid comprises water or another liquid. The reactant gases, as well as inert gases during purge, are introduced individually into the reactor via inlet 717. A showerhead 727 may be used to distribute the gas flow uniformly in the process reactor. Reactant gases are introduced through a gas supply inlet mechanism including orifices. There may be multiple reactant gas tubes and inlets. A vacuum pump connected to outlet 719 can draw out gases between PDL cycles.

Various details of the apparatus have been omitted for clarity sake, and various design alternatives may be implemented. For example, a separate station may be built to integrate and perform the catalytic inhibition process described above.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily with reference to a PDL embodiment herein, other deposition techniques, such as ALD, can also be used in accordance with the invention. Also, while the invention has been described primarily in terms of preparing integrated circuits, it is not so limited. Accordingly, the present embodiments are to be considered as illustrative and not restrictive, and the invention is not to be limited to details given herein, but may be modified within the scope and equivalents of the appended claims.

The invention claimed is:

1. A method for forming a dielectric film, the method comprising:
   a) providing in a deposition reaction chamber a substrate having a gap on a surface, the gap having a top opening and a surface area comprising a bottom and sidewalls running from the top to the bottom; and
   b) selectively depositing a dielectric film in the gap by:
   applying a film formation catalyst or a catalyst precursor on at least a portion of the gap surface area;
   exposing the substrate surface to a precursor gas such that a dielectric layer is preferentially formed on said at least a portion of the gap surface area; and
   solidifying the as-formed dielectric layer to form a solid dielectric layer on said at least a portion of the gap surface area,
   further comprising selectively inhibiting film growth at a portion of the gap with an agent.

2. The method of claim 1 further comprising, after forming a solid dielectric layer, repeating (b) to form an additional solid dielectric layer in the gap.

3. The method of claim 2 wherein (b) is repeated until the gap is filled with solid dielectric material.

4. The method of claim 1 wherein applying a film formation catalyst or a catalyst precursor on at least a portion of the gap surface area comprises applying the film formation catalyst or a catalyst precursor on a portion representing less than all of the gap surface area.

5. The method of claim 4 wherein the portion of the gap surface area where the preferential application of the catalyst or catalyst precursor occurs comprises the bottom of the gap.

6. The method of claim 4 wherein the portion of gap surface area where the preferential application of the catalyst or catalyst precursor occurs comprises the sidewalls at the top of the gap.

7. The method of claim 1 wherein the film formation catalyst or catalyst precursor is selected from the group consisting of: an organic acid, an anhydride of an organic acid, a dialkylphosphate, an alkysphosphate, a phosphonic acid, a phosphinic acid, a phosphorus oxide, an alkylamine, an arylamine, an alkyboronic acid, an arylboronic acids, a sulphonic acid, water, an ammonium salt, a phosphonitrile compound, a boron triflate, an inorganic acids, an anhydride of an inorganic acids, and combinations thereof.

8. The method of claim 1 wherein the film formation catalyst or catalyst precursor is an organic acid or an anhydride thereof.

9. The method of claim 1 wherein the film formation catalyst or catalyst precursor is acetic acid or an anhydride thereof.

10. The method of claim 1 wherein solidifying the as-formed dielectric layer comprises polymerizing the as-formed dielectric layer.

11. The method of claim 1 wherein film growth is inhibited at the top of the gap.

* * * * *